US005608318A

United States Patent [19]
Yasui

[11] Patent Number: 5,608,318
[45] Date of Patent: Mar. 4, 1997

[54] INDUCTIVE SENSOR CIRCUIT WITH COIL RESISTANCE COMPENSATION

[75] Inventor: Katsuaki Yasui, Tokyo, Japan

[73] Assignee: Mitsubishi Denki Kabushiki Kaisha, Tokyo, Japan

[21] Appl. No.: 589,618

[22] Filed: Jan. 22, 1996

[30] Foreign Application Priority Data

Aug. 31, 1995 [JP] Japan .................................. 7-223689

[51] Int. Cl.$^6$ .............................. G01L 3/10; G01L 1/12; G01R 33/18; G01R 27/26
[52] U.S. Cl. ................ 324/233; 73/862.333; 324/209; 324/225; 324/656
[58] Field of Search ...................... 324/209, 225, 324/233, 234, 238, 654, 656, 657, 207.12, 207.18, 207.19; 73/862.331, 862.333, 862.334, 862.335, 862.336

[56] References Cited

U.S. PATENT DOCUMENTS

| | | | |
|---|---|---|---|
| 3,159,784 | 12/1964 | Haslett et al. | 324/238 X |
| 3,337,796 | 8/1967 | Hentschel et al. | 324/233 |
| 5,131,281 | 7/1992 | Utsui et al. | 324/209 |
| 5,419,206 | 5/1995 | Kamioka et al. | 324/209 X |

OTHER PUBLICATIONS

"Magnetostrictive Torgue Sensor" by Yoshihiko Utsui et al, Ref. No. MAG–88–157, Oct. 11, 1988, published in the transactions of the magnetics society of the Institute of Electrical Engineers of Japan.

Primary Examiner—Gerard R. Strecker
Attorney, Agent, or Firm—Sughrue, Mion, Zinn, Macpeak & Seas

[57] ABSTRACT

A sensor circuit has coils 3a, 3b whose inductances change in response to a change in a physical quantity. A drive circuit 4A applies an a.c. drive voltage to the coils. A voltage detector circuit 5 senses the voltage across each coil. A current integration circuit 10 integrates the current through each coil starting at the time of a polarity inversion of the drive voltage, and outputs a control signal C1, C2 until the time the integrated value of the coil current becomes zero. A phase detector circuit 6A detects the coil voltage to generate a detection voltage Vd during the time the current integration circuit outputs the control signal. A smoothing circuit 7 processes the detection voltage to output a mean voltage Vm. The sensor circuit eliminates any adverse effects of the internal resistances of the coils by inverting and offsetting the resistive component of the coil voltage during the detection period.

4 Claims, 5 Drawing Sheets

INDUCTIVE SENSOR CIRCUIT WITH COIL RESISTANCE COMPENSATION

BACKGROUND OF THE INVENTION

1. Field of the Invention

This invention relates to a circuit that measures a physical quantity by detecting minute changes in the inductance of a coil used in such an apparatus as a magnetostrictive torque sensor, etc., and in particular, to a sensor circuit that can offset the effect of coil internal resistance, to perform high precision sensing of a physical quantity.

2. Description of the Related Art

An example of a sensor circuit for measuring a physical quantity by detecting minute changes in the inductance of a coil is described in the paper "Magnetostrictive Torque Sensor" by Yoshihiko UTSUI, et al published in the transactions of the magnetics society of the Institute of Electrical Engineers of Japan (reference number MAG-88-158, Oct. 11, 1988)

FIG. 3 is a block diagram of the conventional sensor circuit described in the above article (FIG. 4 in the referenced publication), and FIG. 4 shows the main parts of FIG. 3 (FIG. 5 in the referenced publication).

In FIG. 3, torque receiver shaft 1 is a rotating shaft, and first and second magnetic substances 2a and 2b are magnetostrictive layers affixed to the outer circumferential surface of torque receiver shaft 1.

As shown, first magnetic substance 2a is formed in multiple strips oriented at a fixed angle (=45°) relative to the center axis of torque receiver shaft 1. Second magnetic substance 2b is separated from first magnetic substance 2a, along the length of the shaft, and is formed in multiple strips oriented at a fixed angle perpendicular to that of first magnetic substance 2a (=−45°).

First and second coils 3a and 3b are separately positioned outside of and facing first and second magnetic substances 2a and 2b, respectively; and have inductances L1 and L2, and internal resistances r1 and r2, respectively, as shown in FIG. 4.

In FIG. 4, the first and second coils 3a and 3b, which are the sensor circuit coils, are connected in series with each other. Their inductance changes in response to a change in some physical quantity (such as a torque applied to torque receiver shaft 1).

In FIG. 3, drive circuit 4, connected across the series-connected combination of coils 3a and 3b, applies drive voltage Va to coils 3a and 3b to produce the coil current i.

Voltage detector circuit 5 outputs coil voltage Vc based on the voltages V1 and V2 generated across coils 3a and 3b by the application of drive voltage Va; e.g., the gain G times the differential of the voltages (V1−V2).

In response to a control signal C from drive circuit 4, phase detector 6 inputs coil voltage Vc, and outputs the result as detection voltage Vd.

Smoothing circuit 7 performs a smoothing process on detection voltage Vd to generate, as the final sensor output signal at the output terminal, a d.c. mean voltage Vm, responsive to changes in the inductances L1 and L2 of coils 3a and 3b, respectively.

Next, the operation of the conventional sensor circuit of FIGS. 3 and 4, with respect to the sensing of a physical quantity (e.g. torque), will be explained, with reference to the waveforms of FIG. 5.

FIG. 5 shows the changes, over time, of various signal voltages occurring in the conventional sensor circuit in a magnetostrictive torque sensing system application. As shown, drive voltage Va is a rectangular waveform having an a.c. cycle time T. Va periodically switches between positive and negative levels centered around 0 V once each T/2 half cycle, a fixed time.

If a torque is applied to torque receiver shaft 1, a principal stress will be created in torque receiver shaft 1 in the direction of the two fixed angles (=±45°).

Due to the Villari effect, when this stress is created, the permeability of the magnetic strips 2a and 2b changes, with the permeability change being in one direction for tensile stress, and in the opposite direction for compression stress.

Accordingly, the inductance of one of the coils 3a and 3b will increase, and that of the other coil will decrease. This change in inductances L1 and L2 will cause a corresponding change in coil voltage Vc, and ultimately, in detection voltage Vd and mean voltage Vm. Thus the magnitude of the externally applied torque can be known by sensing the mean voltage Vm of detection voltage Vd.

In other words, as shown in FIG. 5, drive circuit 4 generates drive voltage rectangular waveform Va across the series combination of first and second coils 3a and 3b, causing coil current i to flow.

Now, if r1 and r2, the internal resistances of coils 3a and 3b, respectively, are assumed to be extremely low, then i, the coil current flowing in coils 3a and 3b, can be expressed in terms of L1 and L2, the inductances of coils 3a and 3b, respectively, by equation (1), below:

$$i = \int Va \cdot dt / (L1 + L2) \quad (1)$$

And voltages V1 and V2 across the terminals of coils 3a and 3b, respectively, are given by equations (2) and (3), below:

$$V1 = L1/(L1+L2) \times di/dt \quad (2)$$
$$\phantom{V1} = L1/(L1+L2) \times Va$$

$$V2 = L2/(L1+L2) \times di/dt \quad (3)$$
$$\phantom{V2} = L2/(L1+L2) \times Va$$

Voltage detector circuit 5 takes the difference between the above V1 and V2 voltages (=V1−V2), and outputs a coil voltage Vc equal to the voltage differential times the gain G, as expressed in equation (4), below:

$$Vc = (V1 - V2) \times G \quad (4)$$
$$\phantom{Vc} = (L1 - L2)/(L1 + L2) \times Va \times G$$

As is evident from equation (4), when L1 and L2, the inductances of coil 3a and 3b, respectively, are equal, the coil (differential) voltage Vc output by voltage detector circuit 5 will be zero, regardless of the value of drive voltage Va. If the inductances differ, however, the coil voltage Vc derived from the differential voltage will assume some non-zero level. If L2 is greater than L1, for example, the phase of the coil voltage Vc waveform will be opposite to that of the drive voltage Va, which is the case shown in FIG. 5.

At the same time as coil voltage Vc is being output by voltage detector circuit 5, drive circuit 4 outputs control signal C, which is synchronous with drive voltage Va (FIG. 5), and is also provided as an input to phase detector 6.

When control signal C is at a low level, phase detector circuit 6 outputs coil voltage Vc, as is, as a detection voltage Vd of the same polarity; and when control signal C is at a high level, phase detector 6 inverts coil voltage Vc, and outputs it as a detection voltage Vd of opposite polarity.

As a result, detection voltage Vd is a d.c. voltage that is directly proportional to the difference in the inductances of coils 3a and 3b (L2−L1).

Accordingly, if L2>L1, then detection voltage Vd>0; and if L2<L1, then detection voltage Vd<0. In other words, the magnitude and polarity of detection voltage Vd are functions of the magnitude and direction, respectively, of the physical quantity being sensed.

Now, since noise is superimposed on detection voltage Vd during phase detection, smoothing circuit 7 first performs a smoothing process on detection voltage Vd, after which it is output as d.c. mean voltage Vm.

The above describes the operation of an ideal sensor circuit, where r1 and r2, the internal resistances of coils 3a and 3b, are extremely small.

In actual sensor circuits, however, where small diameter wire is used in coils 3a and 3b to reduce physical size, the internal resistances r1 and r2 easily become too large to ignore.

Operation will now be described for a conventional sensor circuit having larger internal resistances r1 and r2, referring this time to FIG. 6.

In FIG. 6, Va, the drive voltage applied to the coils (=V1+V2), is separated into its resistive and inductive voltage components, Vr and VL. Thus, as shown in FIG. 6, along with drive voltage Va, coil current i, and control signal C, we also have Vr, the voltage developed due to the internal resistance of the coils (r1+r2), and VL, the voltage developed due to the inductance of the coils (L1+L2).

In this case, the drive voltage Va is the sum of Vr and VL.

If r1 and r2 (the internal resistances of the coils) can be ignored, as they were in the above description (FIG. 5), then the drive voltage Va waveform will exactly match the inductive component voltage VL waveform.

If coil internal resistances r1 and r2 are too large to be ignored, however, a resistive component voltage Vr, proportional to coil current i, is also developed, and a mismatch will exist between drive voltage Va and the inductive component voltage VL.

The larger r1 and r2 (the coil internal resistances), and the longer the a.c. cycle period T of the drive voltage Va, the more conspicuous will be this VL/Va mismatch.

If the a.c. cycle period T is made extremely long, for example, a voltage proportional to the coil internal resistance difference (r2−r1) will appear in the differential coil voltage Vc, and the sensor circuit will thus be incapable of accurately measuring the coil inductances L1 and L2.

If the internal resistances of the coils are precisely matched (r1=r2), this effect of internal resistances r1 and r2 will not appear in the differential coil voltage Vc. In a sensor circuit that measures physical quantity by sensing variations in inductances L1 and L2, where small diameter coil wire is used as discussed earlier, however, significant variances in internal resistances r1 and r2 are unavoidable.

Accordingly, where coils 3a and 3b are mass-produced, it is extremely difficult to maintain precisely matched r1 and r2 internal resistances in all of the parts produced.

Also, since the resistance of the coil wire varies with temperature, it is extremely difficult to eliminate the effect of internal resistances r1 and r2 on the differential coil voltage Vc over the entire temperature range. Consequently, an error is produced in the mean voltage Vm obtained as the final output, due to the effect of temperature induced variations of the internal resistances r1 and r2.

Conventional sensor circuits such as the one discussed above simply detected a differential coil voltage Vc in response to a control signal C synchronous with the timing of polarity inversions in drive voltage Va to obtain a detection voltage Vd, and also outputted a mean voltage Vm. Therefore, when coils having large internal resistances r1 and r2 were used, the circuits became incapable of accurately measuring the coil inductances L1 and L2, due to the presence of voltage Vr (FIG. 6) proportional to coil current i. This problem rendered the circuits incapable of accurately sensing a physical quantity.

The above problem is especially prominent when small diameter coil wire is used to reduce physical size. When small wire is used, variances in the internal resistances r1 and r2 become larger. Also, resistance varies with temperature. These combined factors make it extremely difficult to eliminate the effect of internal resistances r1 and r2 on coil voltage Vc, and an error is therefore produced in the mean voltage Vm, making the circuit incapable of performing accurate sensing of a physical quantity.

SUMMARY OF THE INVENTION

The present invention was devised to solve the above problem. Its object is to obtain a sensor circuit in which there is no error in the mean voltage that corresponds to the sensor output, and in which high-precision sensing of a physical quantity can therefore be performed even when the coils have high internal resistances.

The foregoing object is achieved by providing a sensor circuit comprising coil means whose inductance changes in response to a change in a physical quantity; a drive circuit that applies an a.c. drive voltage to the coil means; a voltage detector circuit that senses a coil voltage produced at the coil means due to the application of the drive voltage; a current integration circuit that integrates the current flowing in the coil means due to the application of the drive voltage, starting at the time of a polarity inversion of the drive voltage, and outputs a control signal until the time the integrated value of the coil current becomes zero; a phase detector circuit that detects the coil voltage to generate a detection voltage during the time the current integration circuit outputs the control signal; and a smoothing circuit that performs a smoothing process on the detection voltage to output a mean voltage, whereby the physical quantity is sensed based on the mean voltage in response to a change in the inductance of the coil means.

In one version of the invention, the drive voltage has a rectangular waveform in which the voltage switches between a positive value and a negative value at set time intervals; and wherein the control signals comprise: a first control signal having a first output period that extends from the time at which the drive voltage switches from the positive to the negative value to the time at which the integrated current value reaches zero; and a second control signal having a second output period that extends from the time at which the drive voltage switches from the negative to the positive value to the time at which the integrated current value reaches zero; and wherein the phase detector outputs, as the detector voltage, the coil voltage with its polarity unchanged during either one of the first and second output periods, and with its polarity inverted, during the other one of the first and second output periods.

In another version of the invention, the coils comprise: a first coil whose inductance changes in response to the change in the physical quantity; and a second coil connected in series to the first coil and having an inductance which changes in an opposite relation to the change of the first coil in response to a change in the physical quantity; wherein the voltage detector circuit outputs, as the coil voltage, an amplified differential value between the voltages produced on the first and second coils.

In yet another version of the invention, the coils of the sensor circuit comprise: a first coil whose inductance changes in response to a change in the physical quantity; and a second coil connected in series with the first coil and having an inductance which remains constant regardless of changes in the physical quantity; wherein the voltage detector circuit outputs, as the coil voltage, an amplified differential value between the voltages produced on the first and second coils.

DESCRIPTION OF THE PREFERRED EMBODIMENTS

First Embodiment

Figure 1:
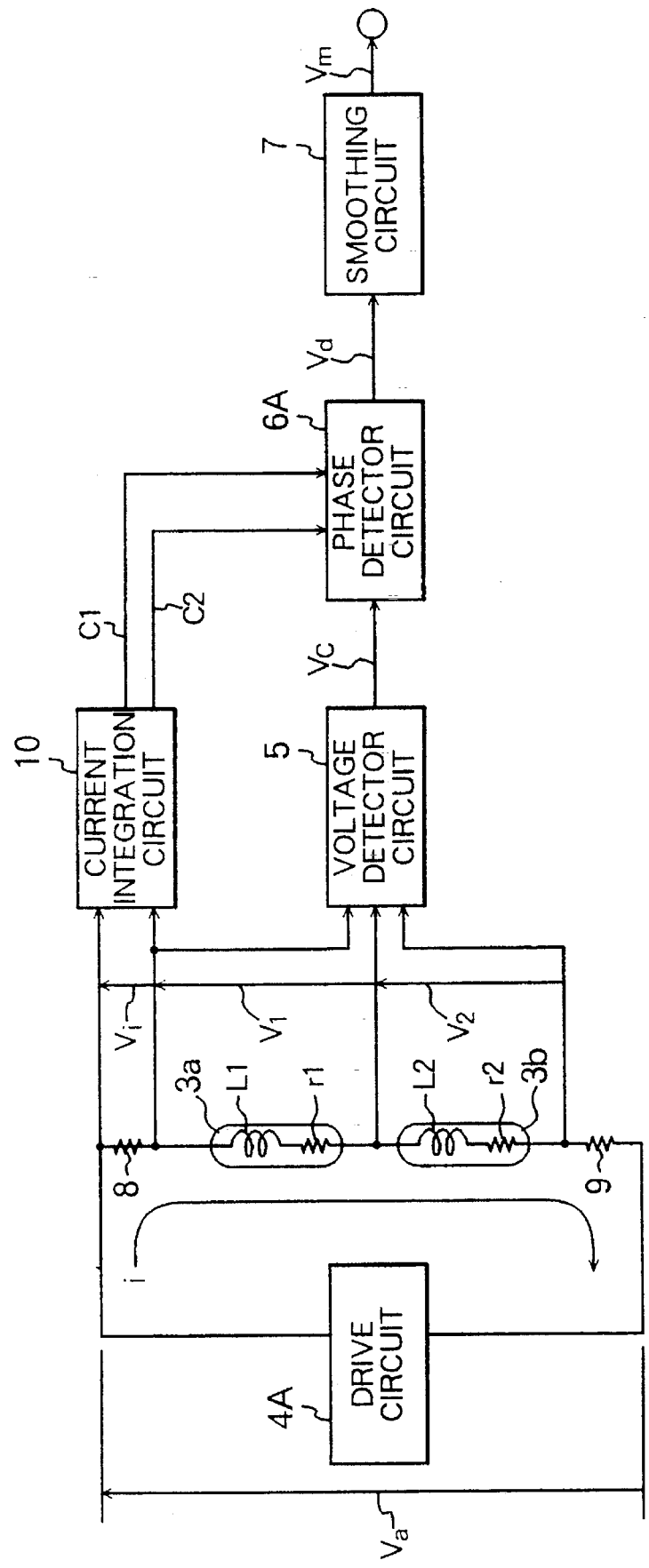
FIG. 1 is a block diagram of a first embodiment of this invention.
Figure 2:
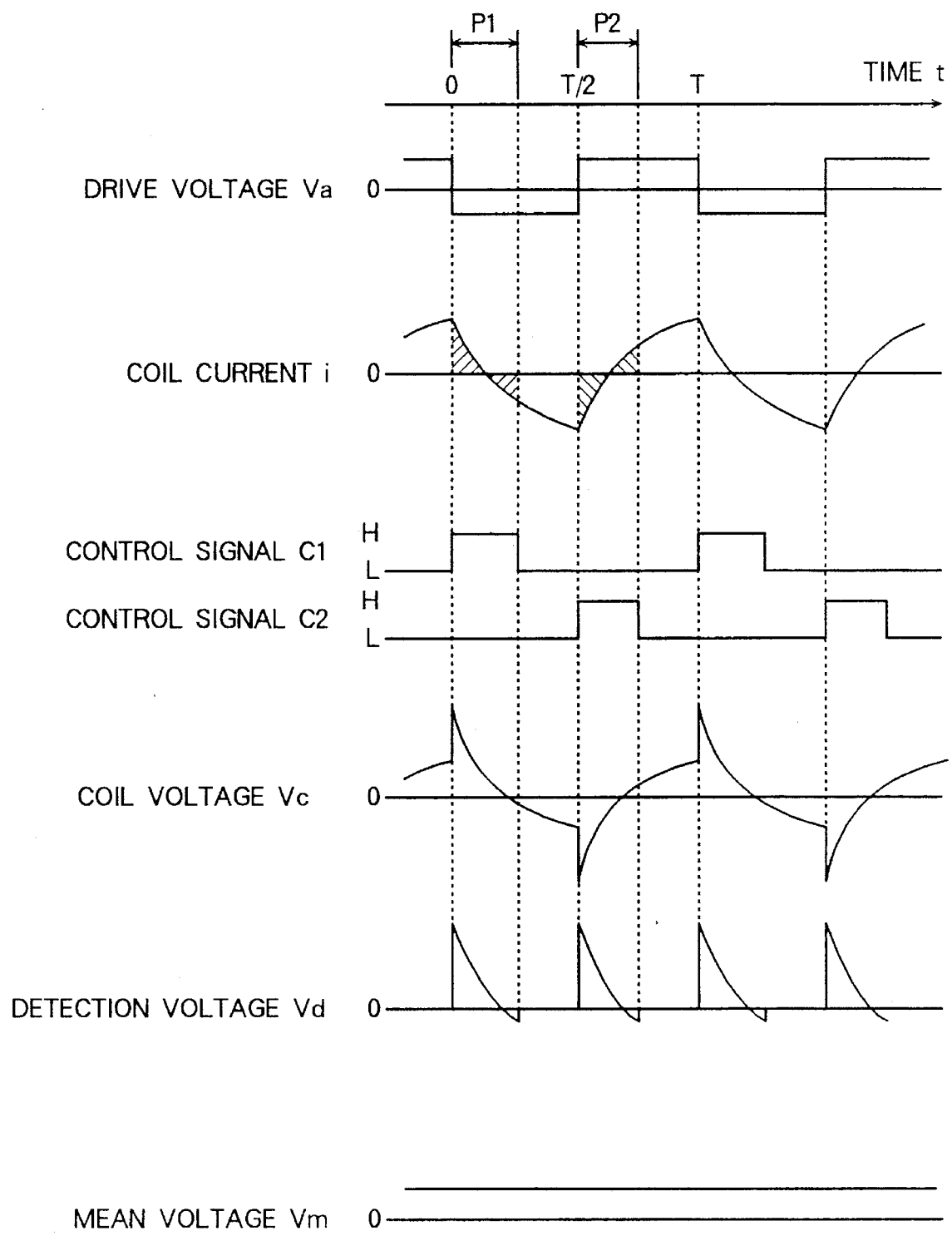
FIG. 2 is a waveform diagram showing the operation of the first embodiment of this invention.

The first embodiment of the invention is explained below, with reference to the drawing. FIG. 1 is a block diagram of this embodiment of the invention, and FIG. 2 is a waveform diagram showing variations over time of various signal voltages occurring in the circuit of FIG. 1.

In FIG. 1, drive circuit 4A and phase detector circuit 6A correspond to the above drive circuit 4 and phase detector circuit 6, respectively. Similarly, coils 3a and 3b, voltage detector circuit 5, and smoothing circuit 7 also correspond to their respective counterparts in FIGS. 3 and 4.

Figure 3:
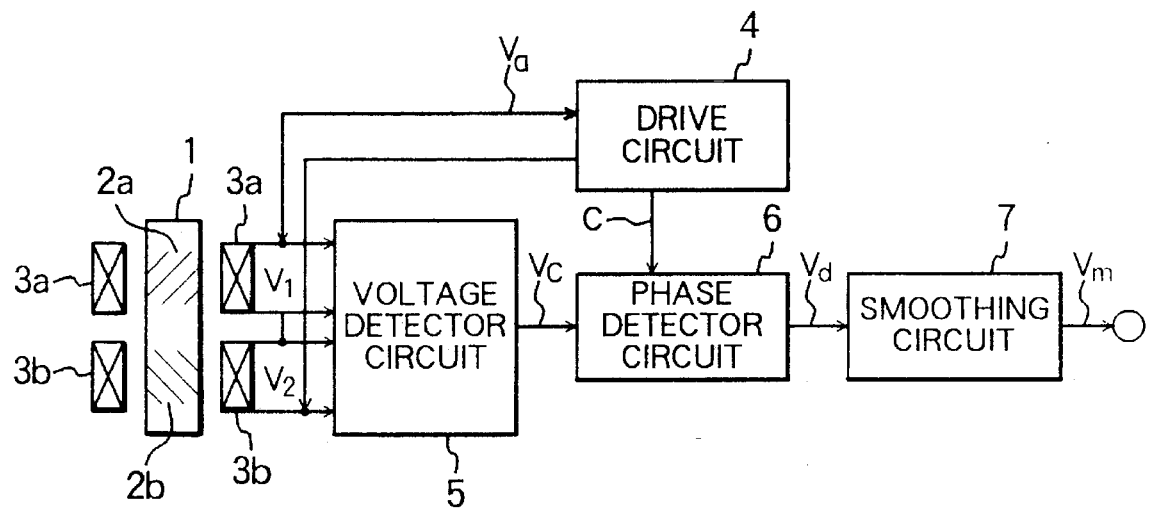
FIG. 3 is a block diagram of a conventional sensor circuit in a torque sensing system application.
Figure 4:
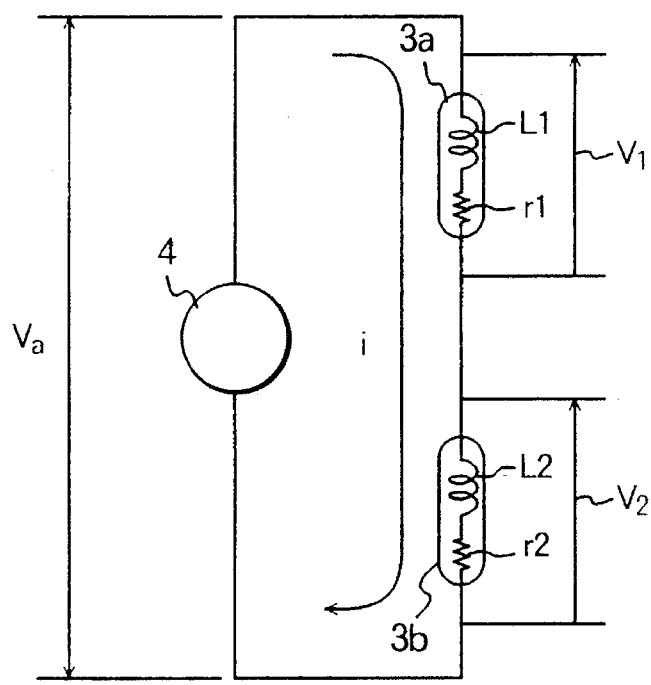
FIG. 4 is a schematic diagram showing interconnections in the coil portion of FIG. 3.
Figure 5:
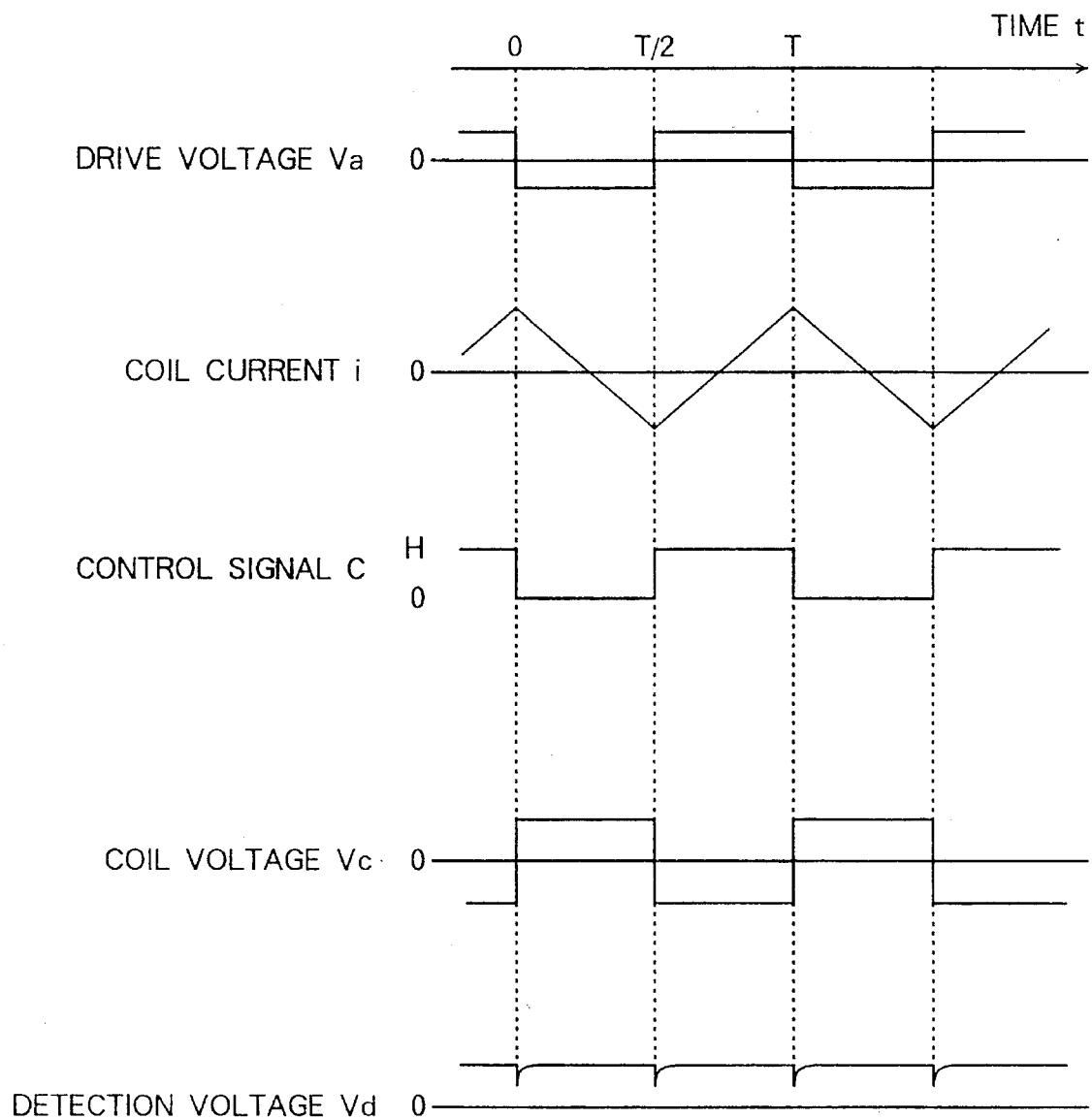
FIG. 5 is a waveform diagram showing the operation of a conventional sensor circuit.
Figure 6:
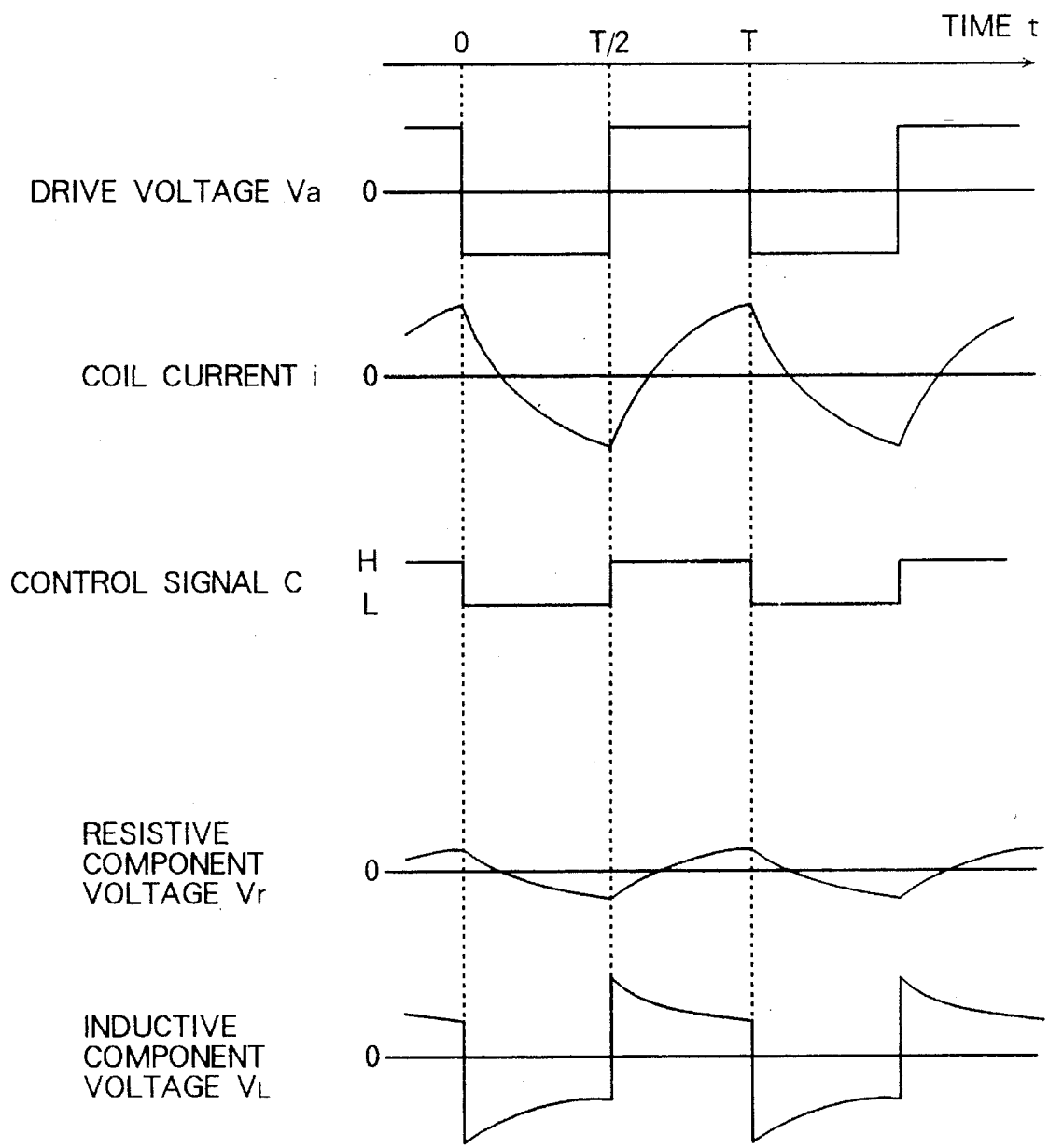
FIG. 6 is a waveform diagram showing the operation of a conventional sensor circuit in which the coils have large internal resistances.

Also, although not illustrated, torque receiver shaft 1 with its magnetic substance strips 2a and 2b (the object being measured) is configured as shown in FIG. 3.

Resistors 8 and 9, which have equal resistance values, are inserted at the ends of the series-connected first and second coils 3a and 3b to form a series string comprising resistor 8, first coil 3a, second coil 3b, and resistor 9, in that order. The purpose of resistor 9 is to maintain the symmetry of the series circuit comprising first and second coils 3a and 3b.

This series circuit comprising coils 3a and 3b and resistors 8 and 9 is connected between the terminals of drive circuit 4A, which outputs drive voltage Va.

Connected across resistor 8 is current integration circuit 10.

Current integration circuit 10 takes Vi, the voltage developed across resistor 8 (which corresponds to the coil current i), as its input. It then derives from Vi, an integrated current value, and outputs first and second control signals C1 and C2 based on this integrated current value.

Phase detector circuit 6A detects the differential coil voltage Vc output by voltage detector circuit 5 over output periods P1 and P2 (FIG. 2) of control signals C1 and C2 output by current integration circuit 10, to output detection voltage Vd.

Next, the operation of this first embodiment of the invention will be explained, with reference to the waveform diagrams shown in FIG. 2.

For explanation purposes, the integrated current value of coil current i will be made 0 in order to clearly show only the effect. Also, for the sake of simplicity, the example described will be that for the case where voltage detector circuit 5 detects, as coil voltage Vc, not a differential voltage, but rather the total coil voltage. Accordingly, the waveforms for coil voltage Vc and detection voltage Vd will differ from those shown in FIG. 2, which are for differential voltages.

First, drive voltage Va from drive circuit 4A is applied, causing a.c. coil current i to flow in coils 3a and 3b, as described above. This results in an inductive component voltage VL and resistive component voltage Vr being developed due to the total inductance L and internal resistance r, respectively, of the coils.

Since voltage detector circuit 5 cannot isolate the inductive and resistive components of the voltage (VL and Vr) for detection, it must of necessity detect their composite voltage as coil voltage Vc.

Phase detector 6A phase-detects coil voltage Vc output by voltage detector circuit 5 during output periods P1 and P2, respectively, of the first and second control signals C1 and C2. (Periods P1 and P2 represent the time required for the integrated current value to reach 0 after current integration circuit 10 starts integrating the coil current.)

The integrated current value over the output period P1 starting at the falling edge of drive voltage Va, for example, is expressed by equation (5), below.

$$\int i \cdot dt = 0 \qquad (5)$$

Also, the resistive component voltage Vr developed due to the total internal resistance r of the coil, is expressed by equation (6), below.

$$Vr = r \times i \qquad (6)$$

Therefore, if the coil voltage Vc from the voltage detector circuit is detected during output period P1, and the resulting detection voltage Vd is averaged by smoothing circuit 7, the resulting mean voltage Vm during output period P1 will be as given by equation (7), below.

$$\begin{aligned} Vm &= \int (VL + Vr) \cdot dt/P1 \\ &= \int VL \cdot dt/P1 + r \times \int i \cdot dt/P1 \\ &= \int VL \cdot dt/P1 \end{aligned} \qquad (7)$$

As is evident from equation (7), the effect of the resistive component voltage Vr can be offset by making the integrated current value $\int i \cdot dt = 0$. It then becomes clear that we thereby obtain a mean voltage Vm that is made up of inductive component voltage VL only.

By so doing, we can eliminate the measurement error due to internal resistance r from measurements of the inductance L, to realize a high precision sensor circuit.

It is clear, then, that even for the case where the detection voltage for the total coil is detected as coil voltage Vc, a high precision sensor circuit can be obtained.

If, then, instead of the total coil voltage, the amplified differential of voltages V1 and V2 (V1–V2), developed across series connected first and second coils 3a and 3b, respectively, is detected as coil voltage Vc (as shown in the waveforms of FIG. 2), then by offsetting the effect of internal resistances r1 and r2 as described above, a sensor circuit of even greater precision can be realized.

Also, drive circuit 4A generates a rectangular waveform that switches between positive and negative voltage levels centered around 0 V at set intervals (T/2), as shown in FIG. 2. Current integration circuit 10, then, determines period P1, from the point at which drive voltage Va switches from positive to negative (Va falling edge) to where the integrated current value of coil current i reaches 0, and period P2, from the point at which voltage Va switches from negative to positive (Va rising edge) to where the integrated current value of coil current i reaches 0, and alternately outputs control signals C1 and C2 at set intervals (T/2).

During either one of the first control signal C1 output period P1 or the second control signal C2 output period P2 (P1 is used in the example of FIG. 2), phase detector circuit 6A outputs coil voltage Vc from voltage detector circuit 5, as is, as detection voltage Vd, without changing its polarity; and during the other control signal output period (P2 in the example of FIG. 2), it inverts the polarity of coil voltage Vc prior to outputting it as detection voltage Vd.

As a result, since two pulses of detection voltage Vd are obtained during one cycle time T, a sensor circuit of still greater precision can be realized.

Also, by configuring the system so that, as in the magnetostrictive torque sensing system of FIG. 3, when a torque external to the system is applied to torque receiver shaft 1, the inductance of the first coil 3a or the second coil 3b increases, and the inductance of the remaining coil decreases, a physical quantity, e.g., torque, can be sensed, based on changes in inductances L1 and L2.

Next, the operation of a sensor circuit according to Embodiment 1 of the sensor circuit in a magnetostrictive torque sensor application will be described more concretely, with reference to FIG. 1 and FIG. 2.

First, as described above, coil current i is caused to flow in the series circuit comprising resistor 8, first coil 3a, second coil 3b and resistor 9, connected in that order, by the rectangular wave drive voltage Va output by drive circuit 4A.

Now, since the series circuit that includes coils 3a and 3b includes an inductance L, although drive voltage Va switches from positive to negative at time 0 on time axis t, as shown in FIG. 2, the direction of coil current is still positive after that point, decaying thereafter, and eventually flowing in the negative direction.

Current integration circuit 10 determines coil current i from Vi, the voltage developed across resistor 8, and at the time, the point (t=0), at which drive voltage Va switches from positive to negative (its falling edge), starts integrating coil current i. It then determines period P1, the time it takes the integrated current value of coil current i to reach 0 (the time it takes negative and positive shaded areas in FIG. 2 to become equal). Then it takes the first control signal C1 from a low level to a high level for the duration of period P1 (the first control signal C1 output period).

Next, at the point (t=T/2) where drive voltage Va switches from negative to positive (rising edge), coil current i remains negative after that point, as was true at the falling edge (t=0), increasing thereafter, to eventually flow in the positive direction.

Now, current integration circuit 10 starts integrating coil current i at the rising edge of Va (t=T/2). It then determines period P2, the time it takes the integrated current value of coil current i to reach 0. Then it takes the second control signal C2 high for the duration of period P2 (the second control signal C2 output period).

Voltage detector circuit 5 detects and differentially amplifies voltages V1 and V2 developed across coils 3a and 3b, respectively, to output a differential output voltage as coil voltage Vc.

FIG. 2 shows an example of the coil voltage Vc that would be developed from the differential voltage that would exist if inductances L1 and L2 of coils 3a and 3b, respectively, satisfied the condition L2>L1.

During the first output period P1, when the first control signal C1 is at a high level, phase detector circuit 6A outputs coil voltage Vc as is (without changing its polarity), as detection voltage Vd.

During the second output period P2, when the second control signal C2 is at a high level, it inverts the polarity of coil voltage Vc prior to outputting it as detection voltage Vd. At all other times, it sets the output signal in the high impedance state.

Smoothing circuit 7 performs a smoothing process on the detection voltage Vd during output periods P1 and P2 of control signals C1 and C2, respectively, to output d.c. mean voltage Vm.

Now, from equations (5) through (7), the effect of the resistive component voltage Vr is seen to have been offset due to fact that the value of the integrated current over the output periods P1 and P2 is 0.

Also, since the polarity of the inductive component voltage VL is always the same as that of the drive voltage Va, by sensing the polarity in response to control signals C1 and C2, ultimately, a mean voltage Vm proportional to (L1−L2)/(L1+L2) can be output by smoothing circuit 7.

Thus by eliminating, in this manner, the measurement error due to internal resistance incurred in the measurement of inductance L, a high precision sensor can be obtained.

Second Embodiment

Although in the first embodiment, the characteristic of the change in inductance L2 (the inductance of second coil 3b) with respect to the physical quantity was made to be the opposite of the inductance change characteristic of L1 (the inductance of first coil 3a), L2 (the inductance of second coil 3b) could have been a set value, unaffected by changes in the physical quantity.

Also, although a pair of coils, 3a and 3b, was used, a single coil whose inductance changes with changes in the physical quantity, could have been used instead.

Thus as described above, through this invention, by detecting coil voltage Vc such that the integrated current value of coil current i is 0, the coil resistive component voltage Vr is offset during the phase detection period, the effect of internal resistances r1 and r2 does not appear in the mean voltage Vm that is finally output, and therefore, even if coils having high r1 and r2 internal resistances are used, the inductance measurement error due to internal resistance is eliminated, and as a result, a high precision sensor circuit is obtained.

Also, according to this invention, voltages V1 and V2 developed across series connected first and second coils 3a and 3b, respectively, are differentially amplified to further offset the effect of internal resistances r1 and r2, the result being that an even higher precision sensor circuit is obtained.

In addition, according to this invention, coil voltage Vc is phase-detected such that it is polarity-inverted depending on the states of control signals C1 and C2 output at set intervals (T/2), and two pulses of detection voltage Vd are obtained during one cycle time T of drive voltage Va, the result being that a still higher precision sensor circuit is obtained.

What is claimed is:

1. A sensor circuit, comprising:
   a) coil means having an inductance that changes in response to a change in a physical quantity;
   b) a drive circuit (4A) for applying an a.c. drive voltage to said coil means;
   c) voltage detector circuit (5) for sensing a voltage produced at said coil means due to the application of said drive voltage;
   d) signal processing means for preventing an erroneous sensor circuit output due to inherent and internal ohmic resistances of said coil means, said preventing means comprising:
      1) a current integration circuit (10) for integrating current flowing in said coil means due to the application of said drive voltage, starting at the time of a polarity inversion of said drive voltage, and for outputting a control signal until the time the integrated value of said coil current becomes zero; and
      2) a phase detector circuit responsive to inputs from said voltage detector circuit and said current integration circuit for generating a detection voltage during the time said current integration circuit outputs said control signal; and
   e) a smoothing circuit for performing a smoothing process on said detection voltage to output a mean voltage, whereby said physical quantity is sensed based on said mean voltage in response to a change in the inductance of said coil means.

2. A sensor circuit as recited in claim 1, wherein said drive voltage has a rectangular waveform in which the voltage switches between a positive value and a negative value at set time intervals; and wherein said control signal comprises:

a first control signal component having a first output period that extends from the time at which said drive voltage switches from a positive to a negative value to the time at which said integrated current value reaches zero; and a second control signal component having a second output period that extends from the time at which said drive voltage switches from a negative to a positive value to the time at which said integrated current value reaches zero;

and wherein said phase detector circuit outputs, as said detector voltage, said coil voltage with its polarity unchanged during either one of said first and second output periods, and with its polarity inverted, during the other one of said first and second output periods.

3. A sensor circuit as recited in claim 1, wherein said coil means comprises:

a first coil whose inductance changes in response to a change in said physical quantity; and a second coil connected in series with said first coil and having an inductance which changes in an opposite relation to the change of said first coil in response to a change in said physical quantity;

wherein said voltage detector circuit outputs, as said coil voltage, an amplified differential value between the voltages produced on said first and second coils.

4. A sensor circuit as recited in claim 1, wherein said coil means comprises:

a first coil whose inductance changes in response to a change in said physical quantity; and a second coil connected in series with said first coil and having an inductance which remains constant regardless of a change in said physical quantity;

wherein said voltage detector circuit outputs, as said coil voltage, an amplified differential value between the voltages produced on said first and second coils.

* * * * *